United States Patent
Mittelholzer et al.

(10) Patent No.: US 9,928,923 B2
(45) Date of Patent: Mar. 27, 2018

(54) ESTIMATION OF LEVEL-THRESHOLDS FOR MEMORY CELLS

(71) Applicant: GLOBALFOUNDRIES Inc., Grand Cayman (KY)

(72) Inventors: Thomas Mittelholzer, Zürich (CH); Nikolaos Papandreou, Thalwil (CH); Haris Pozidis, Thalwil (CH)

(73) Assignee: GLOBALFOUNDRIES, INC., Grand Cayman (KY)

(*) Notice: Subject to any disclaimer, the term of this patent is extended or adjusted under 35 U.S.C. 154(b) by 0 days.

(21) Appl. No.: 14/489,983

(22) Filed: Sep. 18, 2014

(65) Prior Publication Data
US 2015/0085591 A1   Mar. 26, 2015

(51) Int. Cl.
G11C 29/02 (2006.01)
G11C 7/10 (2006.01)
G11C 7/14 (2006.01)
G11C 11/56 (2006.01)
G11C 13/00 (2006.01)

(52) U.S. Cl.
CPC .......... G11C 29/021 (2013.01); G11C 7/1006 (2013.01); G11C 7/14 (2013.01); G11C 11/5678 (2013.01); G11C 13/004 (2013.01); G11C 29/028 (2013.01)

(58) Field of Classification Search
CPC .................................................. G11C 29/021
USPC ........................................................ 365/201
See application file for complete search history.

(56) References Cited

U.S. PATENT DOCUMENTS

| | | | |
|---|---|---|---|
| 7,243,275 B2 * | 7/2007 | Gongwer | G11C 11/5628 365/201 |
| 8,000,135 B1 | 8/2011 | Perlmutter et al. | 365/185.03 |
| 8,085,586 B2 | 12/2011 | Golov et al. | 365/185.03 |

(Continued)

FOREIGN PATENT DOCUMENTS

| | | | | |
|---|---|---|---|---|
| CN | 104575592 A | 4/2015 | | |
| EP | 1261139 A2 | 11/2002 | ............ | H03M 13/29 |

(Continued)

OTHER PUBLICATIONS

Yu Cai et al. ("Threshold Voltage Distribution in MLC NAND Flash Memory: Characterization, Analysis, and Modeling", Design, Automation & Test in Europe Conference & Exhibition, 2013).*

(Continued)

*Primary Examiner* — Anthan Tran
*Assistant Examiner* — Mushfique Siddique
(74) *Attorney, Agent, or Firm* — Heslin Rothenberg Farley & Mesiti P.C.; George Blasiak (57) ABSTRACT

Methods and apparatus are provided for determining level-thresholds for q-level memory cells. A plurality of the memory cells are read to obtain respective read signal components. The read signal components are processed in dependence on signal level to produce a signal level vector, comprising a series of elements, indicative of the distribution of read signal components in order of signal level. The signal level vector is scanned with a sliding window of length greater than the spacing of successive window positions in the scan. At each window position, a metric $M_i$ is calculated in dependence on the elements of the signal level vector in the window. A level-threshold for successive memory cell levels is then determined in dependence on variation of the metric over the scan.

20 Claims, 6 Drawing Sheets

(56) References Cited

U.S. PATENT DOCUMENTS

| | | | |
|---|---|---|---|
| 2011/0016370 A1 | 1/2011 | Chen | 358/1.9 |
| 2011/0202711 A1 | 8/2011 | Yang et al. | 711/103 |
| 2011/0225350 A1 | 9/2011 | Burger, Jr. et al. | 711/103 |
| 2011/0258514 A1 | 10/2011 | Lasser | |
| 2011/0296274 A1* | 12/2011 | Mittelholzer | G06F 11/1072 714/755 |
| 2011/0305082 A1 | 12/2011 | Haratsch et al. | 365/185.03 |
| 2012/0230081 A1* | 9/2012 | Close | G11C 5/147 365/148 |
| 2012/0230097 A1* | 9/2012 | Frey | G11C 11/5678 365/163 |
| 2013/0086457 A1* | 4/2013 | Mittelholzer | G11C 11/5678 714/806 |
| 2013/0121080 A1 | 5/2013 | Sommer et al. | 365/185.18 |
| 2013/0135927 A1* | 5/2013 | Jeon | G06F 11/1072 365/185.03 |
| 2013/0163327 A1* | 6/2013 | Karakulak | G11C 16/3431 365/185.02 |
| 2013/0166994 A1 | 6/2013 | Mittelholzer | |
| 2013/0176780 A1* | 7/2013 | Alhussien | G11C 11/5642 365/185.03 |
| 2013/0227380 A1 | 8/2013 | Mittelholzer et al. | 714/807 |
| 2014/0022211 A1* | 1/2014 | Karpin | G06F 3/044 345/174 |
| 2014/0157086 A1* | 6/2014 | Sharon | G06F 11/1012 714/773 |
| 2015/0010143 A1* | 1/2015 | Yang | G09C 1/00 380/28 |
| 2015/0364189 A1* | 12/2015 | Mittelholzer | G11C 13/004 365/163 |
| 2017/0102950 A1* | 4/2017 | Chamberlain | G06F 9/3867 |

FOREIGN PATENT DOCUMENTS

| | | | | |
|---|---|---|---|---|
| GB | 2518632 A | * | 4/2015 | G11C 7/1006 |
| WO | WO2011092532 A1 | | 8/2011 | H03M 13/05 |
| WO | WO2013/093669 A1 | | 6/2013 | G06F 11/10 |
| WO | WO 2013093669 A1 | * | 6/2013 | G06F 11/1032 |

OTHER PUBLICATIONS

N. Papandreou, et al., Drift-Tolerant Multilevel Phase-Change Memory, Memory Workshop (IMW), 2011 3rd IEEE International, pp. 1-4 (2011).

M. K. Qureshi et al., Morph able memory system: a robust architecture for exploiting multi-level phase change memories, ACM SIGARCH Computer Architecture News—ISCA '10, vol. 38 Issue 3, pp. 153-162 (Jun. 2010).

USPTO Global Dossier Report for CN Application No. 201410496142.1, dated Jan. 3, 2018.

First Action, CN Application No. 201410496142.1, dated Mar. 31, 2017.

Second Action, CN Application No. 201410496142.1, dated Sep. 12, 2017.

Notification to Grant Patent Right for Invention, CN Application No. 201410496142.1, dated Dec. 5, 2017.

* cited by examiner

ESTIMATION OF LEVEL-THRESHOLDS FOR MEMORY CELLS

CROSS-REFERENCE TO RELATED APPLICATIONS

This application claims priority under 35 U.S.C. § 119 to United Kingdom Application No. GB 1317081.6 filed Sep. 26, 2013, the entire text of which is specifically incorporated by reference herein.

BACKGROUND

This invention relates generally to estimation of level-thresholds for memory cells. Methods and apparatus are provided for determining thresholds between successive cell levels on readout of q-level memory cells, together with data storage devices incorporating such apparatus.

In solid-state memory such as flash memory and phase-change memory, the fundamental storage unit (the "cell") can be set to q different states, or "levels", permitting storage of information. Each cell can be used to store a $q^{ary}$ symbol with each of the q possible symbol values being represented by a different cell level. In so-called "single-level cell" (SLC) devices, the memory cells can be set to only two levels (q=2) and so can record only binary values. Other devices use so-called "multi-level cells" which can be set to q>2 different cell levels, thus permitting storage of more than one bit per cell.

BRIEF SUMMARY

One example aspect of the present invention provides a level-threshold determination method for q-level memory cells. The method comprises: reading a plurality of the memory cells to obtain respective read signal components; processing the read signal components in dependence on signal level to produce a signal level vector, comprising a series of elements, indicative of the distribution of read signal components in order of signal level; scanning the signal level vector with a sliding window of length greater than the spacing of successive window positions in the scan; at each window position, calculating a metric dependent on the elements of the signal level vector in the window; and determining a level-threshold for successive memory cell levels in dependence on variation of said metric over the scan.

Methods embodying this aspect of the invention may thus provide for self-adaptive determination of level-thresholds on readout of q-level memory cells. The signal level vector, which is produced from the read signal components for a batch of cells and indicates the distribution of these components in order of signal level, is scanned with a sliding window. The concept of a sliding window includes the notional "window" being a group of successive elements in the series being scanned which is "viewed" at any given position of the window in the scan. The length of the window corresponds to the number of elements in the group viewed. The window is moved through successive window positions, with a predetermined spacing, from one end of the series to the other. In methods embodying this aspect of the invention, the length of the window is greater than the spacing of successive window positions during scanning. There is therefore an overlap between the groups of elements in the window at adjacent window positions. The metric calculated at each window position depends on the elements in the window at that position. A level-threshold for successive memory cell levels is then determined based on variation of this metric over the course of the scan. Embodiments of this aspect of the invention may enable more accurate identification of level-thresholds even in the presence of data asymmetry, leading to reduced error-rates in detection and significant improvement in readback performance.

While application to SLC memory can be envisaged, methods embodying this aspect of the invention are particularly advantageous for multi-level memory, i.e. q>2. In this case, a level-threshold for each of the q−1 pairs of successive memory cell levels can be determined in dependence on variation of the metric.

The signal level vector is indicative of the distribution of read signal components in order of signal level. In some embodiments, the signal level vector may be produced by ordering the read signal components according to signal level. Thus, while additional processing steps might also be envisaged, the signal level vector may simply be the vector produced by sorting the batch of read signal components into signal level order, i.e. in order of increasing or decreasing signal level. In other embodiments, the signal level vector may be produced by binning the read signal components according to signal level. This avoids the sorting operation required for ordering the read signal components themselves, offering a particularly simple implementation. While additional processing steps might again be envisaged, the signal level vector may simply comprise the vector of the resulting bin counts for the bins in signal level order.

Various metrics might be employed in methods embodying this aspect of the invention. In preferred methods, however, a reference value is determined for the elements in the window at each window position, and the metric is dependent on absolute difference between each element in the window and the reference value. The reference value preferably comprises an average, conveniently a mean, of the elements in the window. In preferred embodiments, the metric comprises the L1 norm of the differences between respective elements in the window and the reference value. In these methods, the variation of the metric over the scan conveniently exhibits local maxima at positions corresponding to the level thresholds. Hence, each level-threshold can be determined in dependence on location of the local maximum corresponding to that threshold in the metric variation over the scan. If q=2, a single maximum indicates the threshold between the two levels. If q>2 then the local maxima appear in the metric variation in order of level thresholds. Since spurious local maxima may also appear in the data, the level-thresholds for the q−1 pairs of successive memory cell levels can be determined, at least initially, in dependence on location of the q−1 largest local maxima in the metric variation. However, preferred embodiments employ a correction system based on assessment of the error rate in an ensuing detection process using the initial level-thresholds. These embodiments can be employed where multi-level memory cells store respective $q^{ary}$ symbols of N-symbol codewords of a predefined set of valid codewords. The method here includes: reading the memory cells storing a group of codewords to obtain respective read signals each comprising N of said read signal components; detecting a codeword corresponding to each said read signal in dependence on said level-thresholds for the q−1 pairs of successive memory cell levels; calculating an error value dependent on the number of valid codewords detected for the group; and if the error value exceeds a predetermined error threshold, replacing the level-threshold corresponding to the $(q-1)^{th}$-largest local maximum by a new level threshold determined in dependence on location of the $q^{th}$-largest local maximum in said metric variation over the scan.

The level-thresholds determined from the read signal components can then be used for data detection for those read signal components. In particular, an embodiment of a second aspect of the invention provides a method for detecting codewords each having N $q^{ary}$ symbols which are stored in respective q-level memory cells. The method comprises: performing a level-threshold determination method according to the first aspect of the invention, the level-threshold determination method including reading the memory cells storing a group of the codewords to obtain respective read signals each comprising N of said read signal components; and detecting a codeword corresponding to each said read signal in dependence on the or each level-threshold so determined.

Detection methods embodying this aspect of the invention may include calculating statistical data for the distribution of said read signal components corresponding to each memory cell level in accordance with the, or each, level-threshold so determined. The codeword corresponding to each said read signal may then be detected in dependence on the statistical data.

An embodiment of a third aspect of the invention provides apparatus for level-threshold determination on readout of q-level memory cells. The apparatus comprises: a vector generator for receiving a plurality of read signal components, obtained by reading respective memory cells, and processing the read signal components in dependence on signal level to produce a signal level vector, comprising a series of elements, indicative of the distribution of read signal components in order of signal level; a sliding-window scanner for scanning the signal level vector with a sliding window of length greater than the spacing of successive window positions in the scan, and, at each window position, calculating a metric dependent on the elements of the signal level vector in the window; and a threshold identifier for determining a level-threshold for successive memory cell levels in dependence on variation of said metric over the scan.

An embodiment of a fourth aspect of the invention provides a data storage device comprising: memory having q-level memory cells; read/write apparatus for writing $q^{ary}$ symbols in respective memory cells and for reading memory cells to obtain respective read signal components each corresponding to a said symbol; level-threshold determination apparatus according to the third aspect of the invention for receiving a plurality of said read signal components and determining therefrom a level-threshold for successive memory cell levels; and a detector for detecting $q^{ary}$ symbols corresponding to said read signal components in dependence on the or each level-threshold so determined.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-10. When referring to the figures, like structures and elements shown throughout are indicated with like reference numerals.

Detection of data stored in q-level memory cells relies on identifying the different cell levels on readback. In flash and phase change memory (PCM), for example, the different cell levels exhibit different electrical charge and electrical resistance characteristics respectively, and these can be detected via current or voltage measurements on the cells. On readout of cells, the read signal level can be compared with a set of reference signal levels indicative of the q cell levels in order to determine which level each cell is set to and thus detect the stored symbol value. A basic problem here is that the physical quantity measured during cell readout is subject to variability, e.g. due to noise and/or drift in measured values with time or cell usage. For any given stored symbol value and hence cell level, therefore, the actual read signal level obtained on cell-readout is variable. Multiple read operations on cells set to any given cell level will therefore yield a distribution of read signal levels.

Accuracy of the reference signal levels used for data detection is crucial to readback performance. Reference signal levels can be expressed as "level-thresholds" for the q cell levels. For each pair of successive memory cell levels, the level-threshold indicates a read signal level defining the threshold, or boundary, between read signal level distributions corresponding to the two cell levels. The reference signal levels for detection of q-level cells can therefore be expressed as q−1 level-thresholds.

A technique for estimation of reference signal levels uses training data derived from a pool of reference memory cells. Known information is written to the reference cells each time a block of user data is written to memory. The reference cells are then read whenever the user file is read, and the reference cell readings are used to derive estimates for the changing reference signal levels used for detection. The reference cell approach has various disadvantages, including overhead due to use of memory area for reference purposes, increased controller complexity and latency, and varying effectiveness since inherent variability between cells in a memory array means that reference cells may not be truly representative.

More sophisticated techniques for reference level estimation are self-adaptive, using the readback signals from cells storing actual user data to estimate the reference levels used for detection of data in those cells. A self-adaptive technique for reference level estimation is described in US Patent Application Publication No. US 2013/0227380 A1, incorporated herein by reference in its entirety. This application discloses a system for read-detection of length-N, $q^{ary}$-symbol codes in MLC memory. The codewords of these codes thus have N symbols each, where each symbol can take one of q symbol values. Each symbol is recorded in a respective q-level cell by setting the cell to a level dependent on the $q^{ary}$ symbol value. Memory cells are read in batches to obtain read signals corresponding to a group of codewords. Each read signal has N signal components corresponding to respective symbols of a codeword. The read signal components of the entire group of read signals are ordered according to signal value. The resulting ordered component sequence is then partitioned to obtain a plurality of segments each corresponding to a different memory cell level. The size (i.e. number of components) of each of these segments is determined based on predetermined frequency data indicative of expected frequency of occurrence of the corresponding level in use of the code. The boundaries between adjacent segments thus correspond to the level-thresholds described earlier. In this system, the resulting read signal level distributions corresponding to respective memory cell levels are further processed to derive statistical data. This data is used in a subsequent detection process, comprising one or more detection stages, to detect the codewords corresponding to the current batch of read signals. In US 2013/0227380 A1, detection uses vector-based matching techniques which effectively match entire read signals to codewords.

The foregoing self-adaptive technique is a major advance on the reference cell approach, offering much-improved performance even with small data records, i.e. small batch sizes on readback. However, the occurrence of asymmetries in the user data may still present a problem. Data asymmetry in a readback data record means that there is a significant difference in the numbers of cells set to the q different cell levels. Particularly with short data records, as are typical in memory applications, data asymmetries may appear with a certain probability even in the presence of a scrambler at the host. Asymmetries in the user data have been shown to significantly affect detection performance. As an illustration, FIG. 1 of the accompanying drawings indicates occurrence of detection errors in multiple successive readback operations of four thousand data records from multilevel PCM cells. The detection system was based on that of US 2013/0227380 A1 discussed above, and the user data was stored in phase-change memory with (q=4)-level cells after encoding with a length N=8, $4^{ary}$-symbol code. In these results, 82% of the errors are on three batches. These keep showing errors at all simulation time steps as indicated in the figure. The level distributions (i.e. numbers of cells set to the four successive cell levels) in these batches were [89 61 41 65], [77 85 53 41] and [79 84 47 46], showing a clear data asymmetry in each case.

Figure 1:
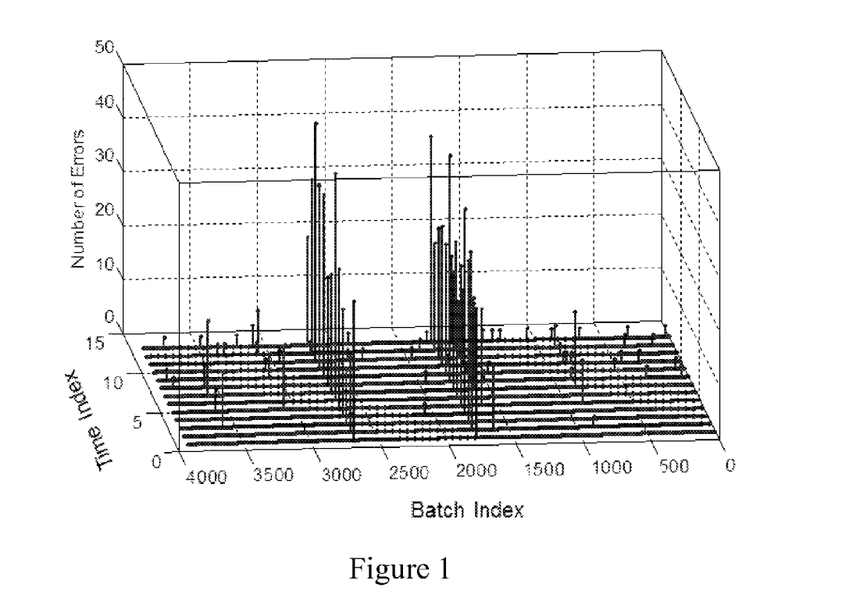
FIG. 1 indicates occurrence of detection errors on readback of multi-level memory using a detection technique.
Figure 2:
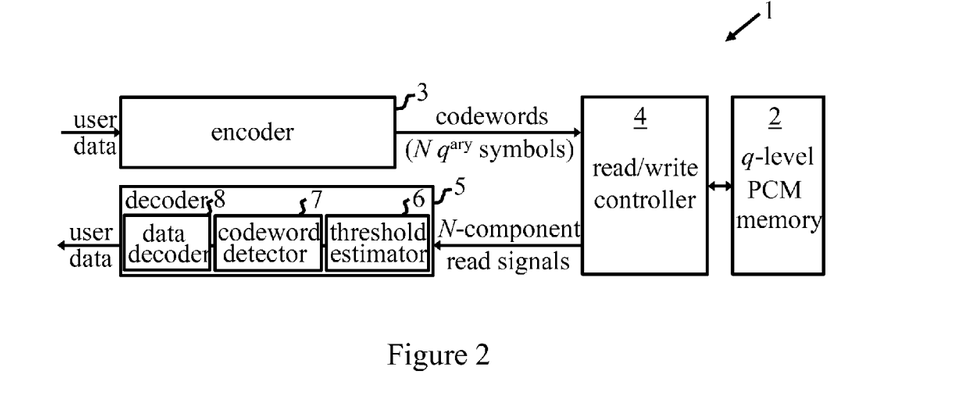
FIG. 2 is a schematic block diagram of a data storage device embodying the invention.

FIG. 2 is a simplified schematic of a data storage device, here a phase-change memory (PCM) device 1, embodying the invention. The device 1 includes phase-change memory 2 for storing data in one or more integrated arrays of multilevel PCM cells. Each of the PCM cells in memory 2 can be set to one of q>2 nominal levels, designated $l_1$ to $l_q$ herein, by adjusting the resistance of the cell in known manner. Though shown as a single block in the figure, in general memory 2 may comprise any desired configuration of PCM storage units ranging, for example, from a single chip or die to a plurality of storage banks each containing multiple packages of storage chips. Device 1 includes an encoder 3 for encoding input user data as discussed below. A read/write controller 4 controls writing of the resulting codewords in memory 2, and subsequent reading of memory cells to obtain read signals corresponding to the codewords. A decoder 5 for processing the resulting read signals includes a threshold estimator 6, codeword detector 7 and a data decoder 8. The threshold estimator 6 comprises functionality for determining level-thresholds for the q cell levels. Codeword detector 8 uses the level-thresholds to detect codewords corresponding to the read signals, and data decoder 8 decodes the detected codewords to recover the original user data.

In operation of device 1, the input user data to be recorded in memory 2 is supplied to encoder 3. In this embodiment, the encoder 3 encodes the input data into codewords of a predetermined set of length-N, ($q^{ary}$-symbol codewords, where in general N≥q. Hence, each codeword has N symbols $s_n$, n=1, 2, . . . , N, and each symbol can take one of q possible values. Any length-N, ($q^{ary}$-symbol code may be employed in encoder 3 here. In general, the encoding process may involve modulation coding of input data or simple mapping of binary input data into $q^{ary}$ symbols without further encoding of the user data.

Codewords output by encoder 3 are written to memory 2 by read/write controller 4. In a write operation, the N symbols of each codeword are stored in respective cells of memory 2. The q possible symbol values correspond to respective predetermined levels $l_1$ to $l_q$ of the q-level cells in memory 2. Each memory cell is thus set to a level dependent on the symbol value to be stored in accordance with the predefined correspondence between symbol values and cell levels. (Note that, when setting a cell to a given level, the actual resistance value x assumed by the cell may lie within a small interval around the nominal resistance value for the level due to write noise). To read a cell in a subsequent read operation, a small probing signal is applied to the cell to obtain a readback signal indicative of the cell's resistance.

Blocks of codewords are written/read substantially simultaneously to memory by controller 4. In this embodiment, controller 4 writes/reads groups of B codewords in parallel so that the codewords in each group are written/read at the same time instants. In a read operation, the memory cells storing a group of B codewords are read to obtain B real-valued read signals y each having N read signal components $y_n$, n=1, 2, . . . , N, indicating the read-back resistance values of the sequence of cells storing the N symbols of a codeword. The signal components $y_1$, . . . $y_N$ of each read signal thus correspond to respective symbols of a codeword. The group of read signals y is supplied to decoder module 5 for use by threshold estimator 6 and codeword detector 7. The threshold estimator 6 processes the read signals as detailed below to determine a current set of level-thresholds for the q memory cell levels. Codeword detector 7 detects codewords corresponding to the current group of read signals based on the level-thresholds determined by level estimator 6 for that group. Data decoder 8 decodes the detected codewords by performing the inverse of the encoding performed in encoder 3, thus recovering the original input data.

In general, functionality of encoder 3 and decoder 5 may be implemented in hardware, software or a combination thereof. For example, the mapping of input data words into codewords in encoder 3 may be implemented using a look-up table, in particular for small codes, or using the well-known technique of enumerative source coding for more efficient operation with large codes. Data decoder 8 can be implemented in corresponding manner to perform the inverse of the coding process. The threshold estimator 6 comprises control logic for implementing the various steps of the level-threshold determination process detailed below, and this control logic can be embodied in hardware or software or a combination of hardware and software components. For example, one or more steps could be performed in whole or in part by software which configures a processor to implement the functionality described, and suitable software will be readily apparent to those skilled in the art. For reasons of operating speed, however, the use of hardwired logic circuits is generally preferred to implement threshold-estimator functionality. Again, suitable implementations will be readily apparent from the description of operation herein.

Figure 3:
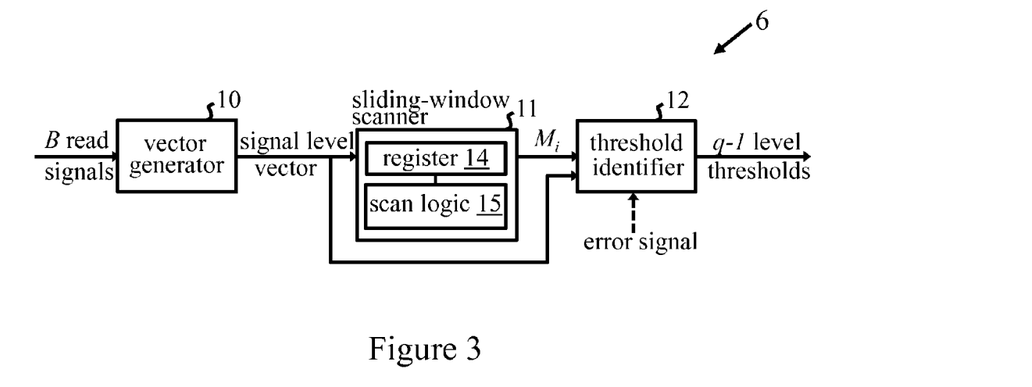
FIG. 3 is a schematic block diagram of a level-threshold estimator in the FIG. 2 device.

FIG. 3 indicates the main functional components of threshold estimator 6. These comprise a vector generator 10 which receives the batch of B read signals y from controller 4, a sliding-window scanner 11 and a threshold identifier 12. Vector generator 10 comprises logic for processing the read signal components of the batch in dependence on signal level to produce a signal level vector. This signal level vector, described further below, comprises a series of elements indicative of the distribution, or spread, of read signal components in order of signal level. The signal level vector is output to sliding-window scanner 11 and threshold identifier 12. The sliding-window scanner comprises a register 14 for storing the input signal level vector, and scan logic 15 for performing a sliding-window scan of the vector as described in detail below. At each position of the sliding window during the scan, the scanning logic calculates a predetermined metric, or measurement quantity, dependent on the elements of the signal level vector in the window. The series of metric values $M_i$ for successive window positions i=1, 2, 3, etc., in the scan is output to threshold identifier 12. The threshold identifier logic determines level-thresholds for the q memory cell levels in dependence on variation of the metric over the scan as determined from the set of input values $M_i$. This process is described further below. As indicated by the dashed arrow in the figure, the threshold identifier may also receive a control input from codeword detector 7. This input can be used to signal an error condition in preferred embodiments prompting performance of a correction process detailed below. Operation of each of the components of threshold estimator 6 is explained in more detail in the following.

The vector generator 10 receives a batch of B read signals $y^{(b)}$, b=1, . . . , B, corresponding to a group of B codewords read from memory 2. Together, the B read signals form a concatenated word $y^B = [y^{(1)}, y^{(2)}, \ldots, y^{(B)}]$ with B×N read signal components corresponding to the B×N stored codeword symbols. In this first embodiment, the vector generator produces the signal level vector by ordering the B×N components of the concatenated word $y^B$ according to signal level. The read signal components are ordered in order of increasing signal level here so that the resulting signal level vector has a series of elements $[y_1^s, y_2^s, \ldots y_{BN}^s]$ corresponding to the ordered read signal components. This vector is then output to the sliding-window scanner 11.

The signal level vector received by sliding-window scanner 11 is stored in register 14. The scan logic scans the signal level vector with a sliding window having a length which is greater than the scan pitch, i.e. the spacing of successive window positions in the scan. This ensures that there is an overlap between the groups of vector elements in the window at adjacent window positions. The window-length and scan pitch are selected, in dependence on the length of the signal level vector and number q of cell levels, to give sufficient resolution in the scan results for level-thresholds to be identified by the process described below. In general, the window length should be small compared to the length of the signal level vector, and windows at adjacent positions should overlap by a fraction of the window length. About 30 to 70 window positions might typically be appropriate over the course of the scan, and a window-overlap of about 40 to 60% at adjacent positions may be suitable. As an illustrative example, for a batch of B=32 read signals using an N=8, $4^{ary}$-symbol code with (q=4)-level memory cells, the signal level vector would have 256 elements. Results presented below used a window length of eight elements and a scan pitch of four elements, giving 63 window positions over the course of the scan. In general, however, parameters can be selected as appropriate for a given system and suitable values will be readily apparent to those skilled in the art.

At each window position in the scan, the scanning logic calculates the value of a metric $M_i$ based on the elements of the signal level vector in the window. In this preferred embodiment, the metric $M_i$ is dependent on absolute difference between each element in the window and a reference value, here the mean value of the elements in the window. In this particular example, the metric $M_i$ is the L1 norm of the differences between respective elements in the window and the mean. Hence, scan logic 15 first calculates the mean value $y_m$ of the window components, and then calculates $M_i$ as:

$$M_i = \sum_{j=i}^{j=w} |y_j - y_m|$$

where $y_j$ is an element in the window and w is the window length. The resulting series of metric values $M_i$ for successive window positions i=1, 2, 3, etc., in the scan is supplied to threshold identifier 12.

Figure 4:
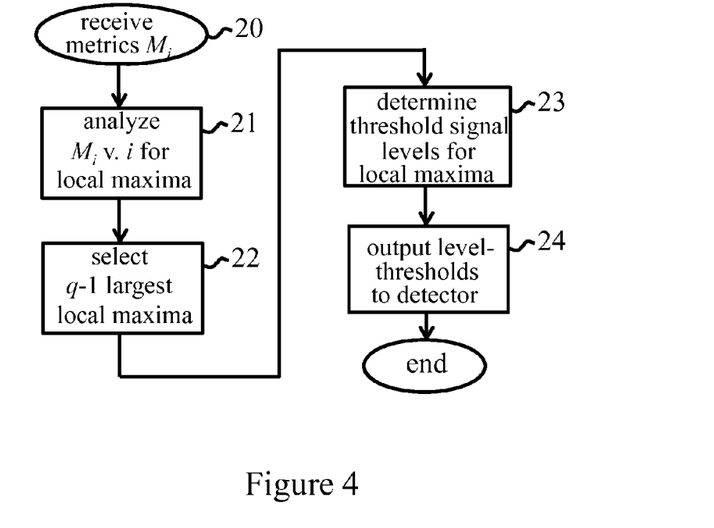
FIG. 4 indicates operation of a threshold identifier in the apparatus of FIG. 3.
Figure 5:
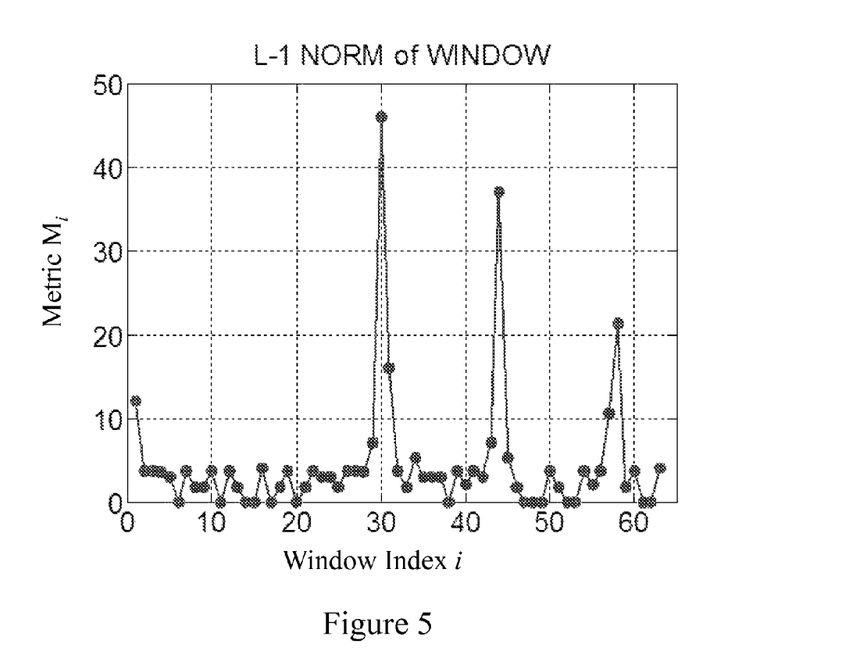
FIG. 5 shows results of a sliding-window scan performed in operation of the FIG. 3 apparatus.

FIG. 4 shows the main functional steps performed by threshold identifier 12 to determine the level-thresholds for the q-level cells. Operation commences, as indicated at step 20, on receipt of the metrics from the sliding-window scanner. In step 21, the threshold identifier logic analyzes the variation of $M_i$ with window index i over the course of the scan. With the preferred metric of this embodiment, the variation of metric value with window position exhibits local maxima, indicative of the level thresholds, at particular window positions. This is illustrated in FIG. 5. This plot shows variation of the metric with window position for a 256-element signal level vector obtained by the above method from B=32 read signals corresponding to length-8, $4^{ary}$-symbol codewords stored in 4-level PCM memory. The sliding-window scan used a window length w of eight elements and a scan pitch of four elements, giving a series of 63 metric values for the 63 successive window positions. A data asymmetry of 70%:30% was simulated between zeroes and ones in the binary user data used to generate the encoded data recorded in the memory cells. It can be seen that the metric variation exhibits three strong local maxima. These correspond, in order of increasing window index, to the level-thresholds for the three pairs of successive memory cell levels $l_1$ and $l_2$, $l_2$ and $l_3$, $l_3$ and $l_4$.

Referring back to FIG. 4, in step 22 the threshold identifier selects the q-1 largest local maxima in the scan results. In step 23, a threshold signal level corresponding to each of these maxima is determined as follows. The window index at which each maximum occurs is first identified from the scan results. The corresponding window position in the signal level vector received from vector generator 10 is then determined for this window index. The transition between adjacent cell levels occurs within the window of vector elements at this position, and the appropriate threshold element is then selected by the threshold identifier logic. Various methods might be envisaged for selecting the threshold element here. In a simplistic embodiment, for example, the threshold may be assumed to occur at the center of the window, whereby the central element (or one of the two central elements for even-length windows) is selected as the threshold element. In this preferred embodiment, however, the threshold identifier logic calculates the difference between each element and the next element in the window. The element for which this difference is a maximum, i.e. the element which is most different from the next element, is then selected as the threshold element. The signal level corresponding to this element then defines the level-threshold. In step 24, the q−1 level-thresholds are output by threshold estimator 6 to the codeword detector 7, and the process is complete.

Figure 6:
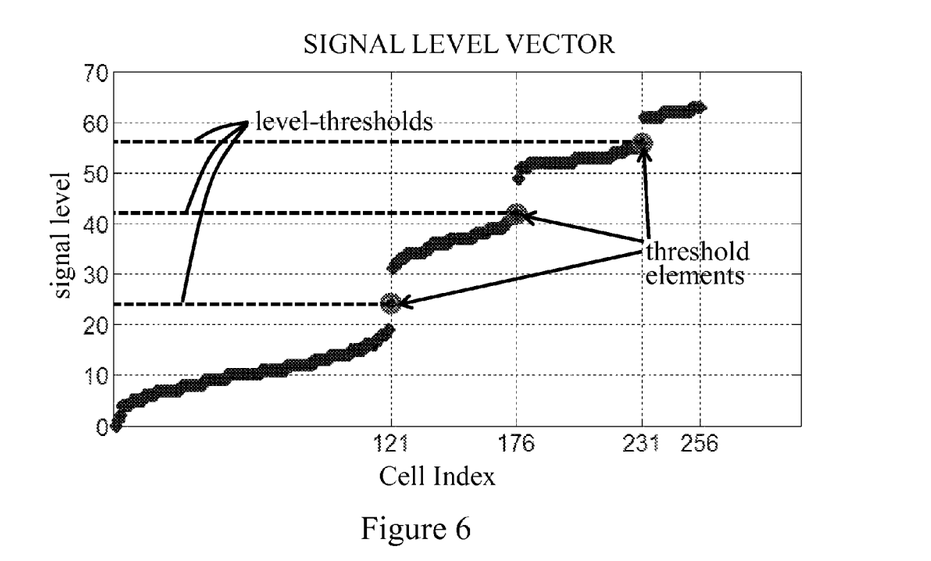
FIG. 6 indicates identification of level-thresholds for a signal level vector produced by the FIG. 3 apparatus.

FIG. 6 shows the outcome of the level-threshold identification process for the signal level vector corresponding to the scan results of FIG. 5. It can be seen that, despite the large data asymmetry, the process results in correct identification of the threshold elements at the transitions between the levels.

The q−1 level-thresholds calculated from the read signals for a group of codewords are used by detector 7 to detect the codewords corresponding to those read signals. Detection of codewords based on the level-thresholds can be performed in a variety of ways. In a simplistic implementation, for example, the level-thresholds could be used directly for codeword detection by comparing the components $y_n$ of each read signal y with these levels to identify the particular cell level, and hence symbol value, to which each read signal component corresponds. In more sophisticated systems, the level thresholds can be used to calculate statistical data for the distribution of read signal components determined as corresponding to each of the memory cell levels in accordance with the calculated level-thresholds. For example, the mean values $\lambda_1$ to $\lambda_q$ and standard deviations $\sigma_1$ to $\sigma_4$ can be calculated from the distributions for the cell levels $l_1$ to $l_4$. The codeword corresponding to each read signal can then be detected based on this statistical data. For example, codeword detector 7 may perform one or more stages of codeword detection using a technique such as ML (maximum-likelihood), MAP (maximum-a-posteriori) or MD (minimum distance) decoding. Particular examples of such detection processes are detailed in our copending US and UK patent applications referenced above, the relevant content of which is incorporated herein by reference. In general, however, any desired detection technique can be employed based on the level-thresholds determined by threshold estimator 6, and suitable implementations for codeword detector 7 will be readily apparent to those skilled in the art.

Figure 7A:
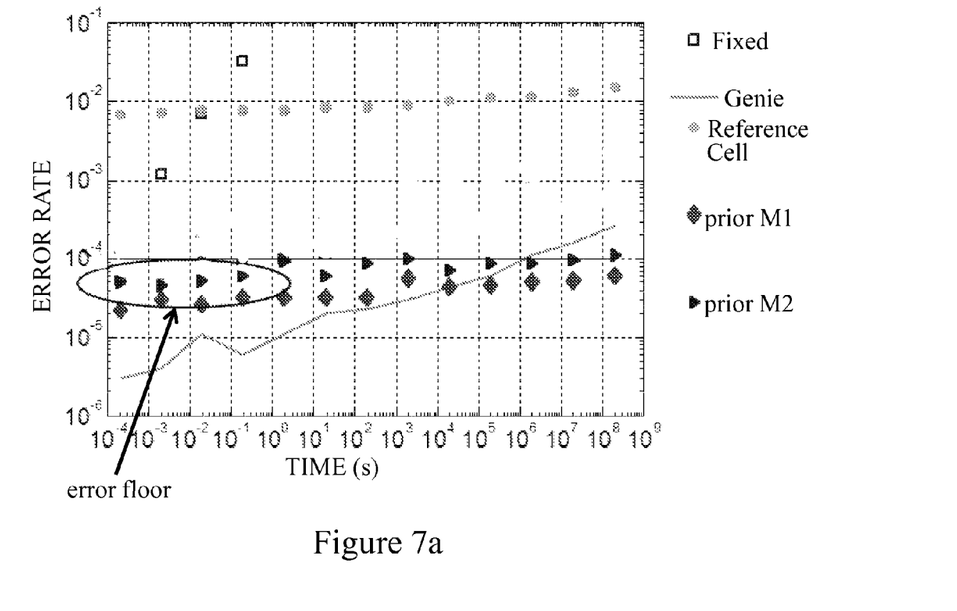
FIGS. 7*a* and 7*b* compare performance of prior detection systems with systems using level-thresholds determined by methods embodying the invention.
Figure 7B:
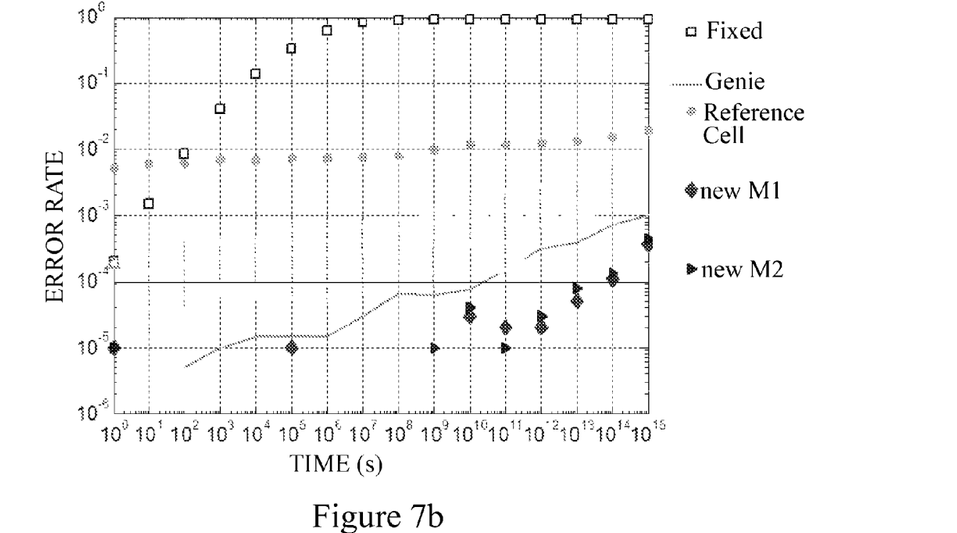
Figure 8:
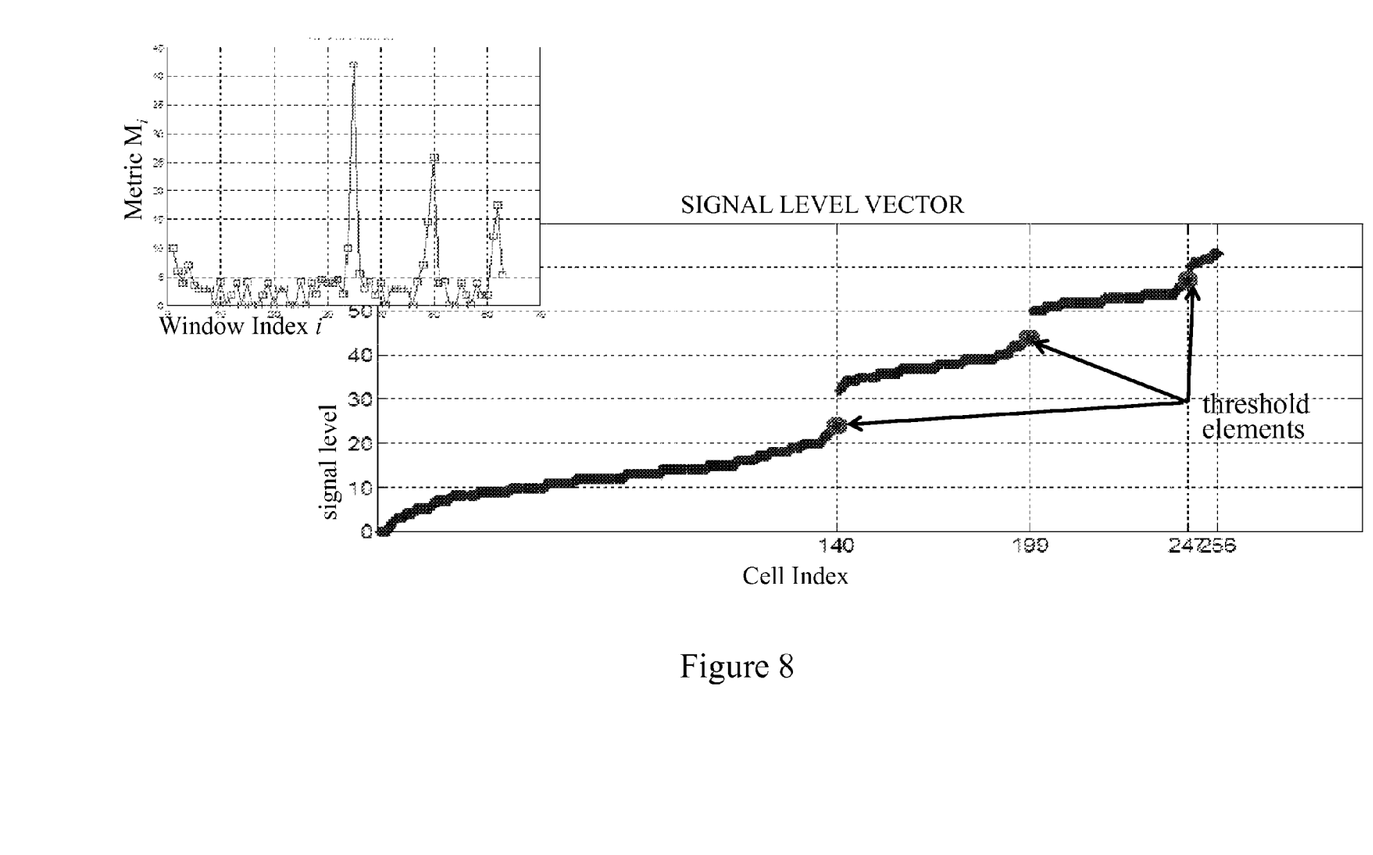
FIG. 8 shows the results of level-threshold estimation in the presence of extreme data asymmetry using a method embodying the invention.
Figure 9:
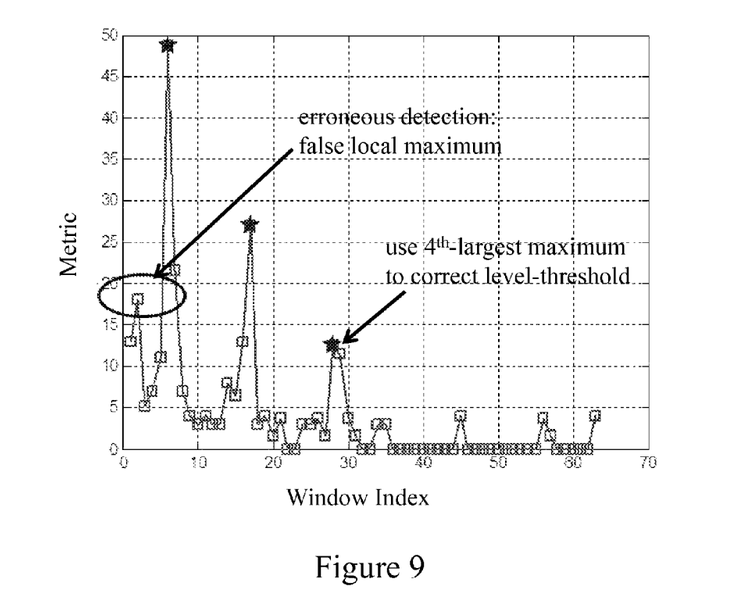
FIG. 9 illustrates operation of a level-threshold correction system employed in preferred embodiments of the invention.

The level-threshold estimation technique described above leads to significant improvement in readback performance. As illustration, FIG. 7*a* plots level error rate as a function of time (and hence increasing level drift) for equivalent readback operations with various prior level estimation and detection systems. The system parameters are generally as described above for FIGS. 5 and 6, including a data asymmetry of 70%:30% between zeros and ones in the user bit stream. The trace labeled "prior M1" corresponds to the system described in our US application referenced above. The trace labeled "prior M2" corresponds to the system of our UK application referenced above. The trace labelled "Reference cell" corresponds to ML-based detection using reference cells to determine the level-thresholds as described earlier. The "Genie" trace corresponds to ML-based detection assuming perfect knowledge of the level statistics $\lambda$, $\sigma$ and hence the level-thresholds. The trace labelled "Fixed" corresponds to MD-based detection using fixed (unvarying) level-thresholds corresponding to the initial values at time t=0. The error floor behaviour of prior methods M1 and M2 due to the data asymmetry is apparent. In contrast, FIG. 7*b* shows the equivalent results with level-thresholds determined by threshold estimator 6 being used in the detection system of our above US application (trace "new M1") and the detection system of our above UK application (trace "new M2"). The improvement in error rates is readily apparent from this figure. No error floor is observed, error rates are reduced, and performance is significantly better than even the Genie-based method. The technique described above thus offers highly accurate identification of level-thresholds in the presence of data asymmetry, even with severe drift in cell levels. Moreover, the technique is robust even in the presence of very large data asymmetry. FIG. 8 shows the results of the level-threshold estimation process for a readback scenario generally as before, but for a 256-symbol data record with 140, 59, 48 and 9 cells set to the four cell levels $l_1$ to $l_4$ respectively. Accurate identification of the thresholds is demonstrated even in this extreme case.

Various modifications to the above embodiment can be envisaged. In an alternative implementation of vector generator 10, for example, the signal level vector may be produced by binning the B×N read signal components according to signal level. That is, a series of "bins", each corresponding to a particular signal level value (or range of values), is defined in the vector generator, and each read signal component is assigned to the appropriate bin according to its signal level. The input read signal components are typically already quantized, being produced at the output of an analogue-to-digital converter (ADC) in read-write controller 4. In a simple implementation, therefore, the vector generator 10 can use as many bins as there are signal component levels at the ADC output. (Alternatively, fewer bins could be employed, each bin corresponding to a range of signal component levels). The resulting bin counts thus indicate the numbers of components with the corresponding levels. Arranged in order of increasing (or decreasing) signal level, these bin counts thus provide a histogram of the distribution of read signal components by signal level. Subsequent operation of the sliding-window encoder 11 and threshold identifier 12 is entirely equivalent with this signal level vector. Binning relies on a pattern matching process which can be implemented using only logic AND gates. This entails much lower complexity than a sorting process for ordering components according to signal level. Embodiments based on binning thus offer a valuable reduction in processing complexity.

Preferred embodiments also implement a correction system based on the detected error rate. In particular, codeword detector 7 can calculate an error value dependent on the number of valid codewords (and hence the number of invalid codewords) detected for the group of read signals using the initial set of level-thresholds determined as above. This error value can be compared with a predefined error threshold in detector 7. If significant numbers of the detected codewords are deemed invalid, i.e. not a member of the predefined set of valid codewords for the code, the error value will exceed the threshold. In this event, codeword detector 7 supplies an error signal to the control input of threshold identifier 12 in FIG. 3. On receipt, the threshold identifier locates the $q^{th}$-largest local maximum in the scan results (temporarily stored for this purpose), and identifies the signal level corresponding to this maximum as a new level-threshold. The threshold identifier then outputs a corrected set of level-thresholds in which the new level-threshold corresponding to the $q^{th}$-largest local maximum replaces the previous level-threshold corresponding to the $(q-1)^{th}$-largest local maximum. This correction process is illustrated schematically in the scan results of FIG. 9. Here, the $3^{rd}$-largest local maximum detected for the initial set of level thresholds was inaccurate. By replacing the erroneous level-threshold corresponding to this maximum by a new level threshold corresponding to the $4^{th}$-largest local maximum, the correct set of level thresholds is achieved. Detection is then performed again for the corrected thresholds, eliminating the error condition which prompted the correction process.

Figure 10:
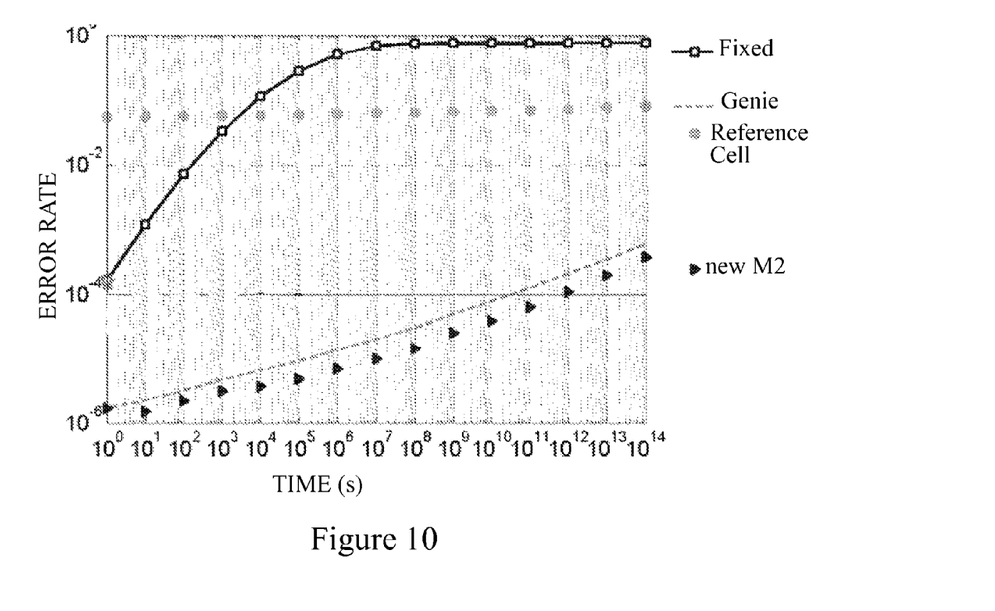
FIG. 10 compares performance of prior detection systems with an embodiment of the invention for readback of small data records.

The above correction system offers even further improvement in detection performance. Moreover, the system offers good performance even with very small data records. By way of illustration, FIG. 10 illustrates performance of the "new M2" method, again in comparison to prior systems, over a long simulation run with $10^7$ cells and a batch size of 16 codewords. A demonstrated by these results, improved performance is achieved, and no error floor is observed, even with such small data records.

Other changes and modifications can of course be made to the exemplary systems described. Various other metrics might be employed in the sliding-window scan for instance. A value other than the mean might be employed as the reference value in the metric, e.g. another form of average, such as the mode (most commonly occurring) value or some form of weighted average, or some representative value other than an average, e.g. the smallest or largest value in the window. The metric $M_i$ might be the L1 norm per se or the result of further processing this value in some way. In general, other functions, for example other norms such as the L2 norm, may be employed here, and metrics might be envisaged which present features other than maxima corresponding to location of the level-thresholds in the scan results. Further processing of components/bin counts might also be involved in generation of the signal level vector in some cases.

While memory 2 uses PCM cells, the techniques described are generic and can of course be applied to other memory cells. Moreover, while application to multilevel cells is particularly advantageous, the technique can also be applied to estimate a level threshold in SLC memory on readout of (q=2)-level cells.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A level-threshold determination method for q-level memory cells, the method comprising:
    reading a plurality of the memory cells to obtain respective read signal components;
    processing the read signal components in dependence on signal level to produce a signal level vector, comprising a series of elements, indicative of a distribution of the read signal components in order of signal level;
    scanning the signal level vector with a sliding window of length greater than a spacing of successive window positions in the scan;
    at each window position, calculating a metric dependent on the elements of the signal level vector in the window and determining a reference value for the elements in the window, wherein the metric is dependent on absolute difference between each element in the window and said reference value; and
    determining a level-threshold for successive memory cell levels in dependence on variation of said metric over the scan and determining said level-threshold in dependence on location of a local maximum corresponding to that threshold in a variation of the metric over the scan, wherein a scan is performed using a scanner comprising a register configured for storing an input signal level vector and scan logic configured for calculating a measurement quantity.

2. A method as claimed in claim 1 including producing the signal level vector by ordering the read signal components according to signal level.

3. A method as claimed in claim 1 including producing the signal level vector by binning the read signal components according to signal level.

4. A method as claimed in claim 1 wherein q>2, the method including determining a level-threshold for each pair of q−1 pairs of successive memory cell levels in dependence on the variation of said metric over the scan.

5. A method as claimed in claim 4 wherein the level threshold for the q−1 pairs of successive memory cell levels are determined in dependence on location of q−1 largest local maxima in the metric variation over the scan.

6. A method as claimed in claim 5 wherein the memory cells store respective symbols of N-symbol codewords of a predefined set of valid codewords, the method including:
    reading the memory cells storing a group of the codewords to obtain respective read signals each comprising N of said read signal components;
    detecting a codeword corresponding to each said read signal in dependence on said level-thresholds for the q−1 pairs of successive memory cell levels;
    calculating an error value dependent on a number of valid codewords detected for the group; and
    if the error value exceeds a predetermined error threshold, replacing the level-threshold corresponding to a (q−1)th-largest local maximum by a new level threshold determined in dependence on location of the qth-largest local maximum in said metric variation over the scan.

7. A method as claimed in claim 1 including determining said level-threshold from the elements in the window at the window position corresponding to said maximum by identifying the element which is most different from the next element in the window.

8. A method as claimed in claim 1 wherein said reference value comprises an average of the elements in the window.

9. A method as claimed in claim 8 wherein said average comprises a mean.

10. A method as claimed in claim 1 wherein said metric comprises a norm of the differences between respective elements in the window and an average.

11. A method for detecting codewords each having N symbols which are stored in respective q-level memory cells, the method comprising:
    reading a plurality of the memory cells to obtain respective read signal components, the memory cells storing respective symbols of N-symbol codewords of a predefined set of valid codewords;

processing the read signal components in dependence on signal level to produce a signal level vector, comprising a series of elements, indicative of a distribution of read signal components in order of signal level;

scanning the signal level vector with a sliding window of length greater than a spacing of successive window positions in the scan;

at each window position, calculating a metric dependent on the elements of the signal level vector in the window;

detecting a codeword corresponding to each said read signal in dependence on the or each level-threshold so determined; and determining a level-threshold for successive memory cell levels in dependence on variation of said metric over the scan and determining said level-threshold in dependence on location of a local maximum corresponding to that threshold in a variation of the metric over the scan, wherein a scan is performed using a scanner comprising a register configured for storing an input signal level vector and scan logic configured for calculating a measurement quantity.

12. A method as claimed in claim 11 including:

calculating statistical data for the distribution of said read signal components corresponding to each memory cell level in accordance with the or each said level-threshold; and detecting the codeword corresponding to each said read signal in dependence on said statistical data.

13. A method as claimed in claim 11 wherein the method includes determining a reference value for the elements in the window, wherein the metric is dependent on absolute difference between each element in the window and said reference value.

14. A method as claimed in claim 13 wherein q>2, the method including determining a level-threshold for each pair of q−1 pairs of successive memory cell levels in dependence on the variation of said metric over the scan.

15. An apparatus for level-threshold determination on readout of q-level memory cells, the apparatus comprising:

a vector generator for receiving a plurality of read signal components, obtained by reading respective memory cells, and processing the read signal components in dependence on signal level to produce a signal level vector, comprising a series of elements, indicative of a distribution of read signal components in order of signal level;

a sliding-window scanner for scanning the signal level vector with a sliding window of length greater than a spacing of successive window positions in the scan, and, at each window position, calculating a metric dependent on the elements of the signal level vector in the window and determining a reference value for the elements in the window, wherein the metric is dependent on absolute difference between each element in the window and said reference value; and a threshold identifier for determining a level-threshold for successive memory cell levels in dependence on variation of said metric over the scan, wherein a scan is performed using a scanner comprising a register configured for storing an input signal level vector and scan logic configured for calculating a measurement quantity.

16. An apparatus as claimed in claim 15 wherein q>2, the threshold identifier being configured to determine a level-threshold for each of q−1 pairs of successive memory cell levels in dependence on variation of said metric over the scan.

17. The apparatus as claimed in claim 16, the threshold identifier being configured to determine said level-threshold in dependence on location of a local maximum corresponding to that threshold in the variation of the metric over the scan.

18. An apparatus as claimed in claim 15 further comprising:

memory having q-level memory cells;

read/write circuit for writing symbols in respective memory cells and for reading memory cells to obtain respective read signal components each corresponding to a said symbol; and a detector for detecting symbols corresponding to said read signal components in dependence on the or each level-threshold so determined.

19. An apparatus as claimed in claim 18 wherein said memory cells are phase-change memory cells.

20. The apparatus as claimed in claim 15, the threshold identifier being configured to determine said level-threshold in dependence on location of a local maximum corresponding to that threshold in a variation of the metric over the scan.

* * * * *

UNITED STATES PATENT AND TRADEMARK OFFICE
CERTIFICATE OF CORRECTION

PATENT NO.       : 9,928,923 B2                                   Page 1 of 1
APPLICATION NO.  : 14/489983
DATED            : March 27, 2018
INVENTOR(S)      : Mittelholzer et al.

It is certified that error appears in the above-identified patent and that said Letters Patent is hereby corrected as shown below:

On the Title Page

In the Foreign Application Priority Data (30): Insert -- United Kingdom GB 1317081.6 09-26-2013 --

Signed and Sealed this
First Day of May, 2018

Andrei Iancu
*Director of the United States Patent and Trademark Office*